United States Patent
Feldmann et al.

(10) Patent No.: US 10,620,659 B2
(45) Date of Patent: Apr. 14, 2020

(54) CLOCK NETWORK ANALYSIS USING HARMONIC BALANCE

(71) Applicant: International Business Machines Corporation, Armonk, NY (US)

(72) Inventors: Peter Feldmann, New York, NY (US); Haifeng Qian, Mount Kisco, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 178 days.

(21) Appl. No.: 15/479,566

(22) Filed: Apr. 5, 2017

(65) Prior Publication Data

US 2018/0292856 A1   Oct. 11, 2018

(51) Int. Cl.
G06F 17/50 (2006.01)
G06F 1/04 (2006.01)
G06F 1/10 (2006.01)

(52) U.S. Cl.
CPC .......... *G06F 1/04* (2013.01); *G06F 1/10* (2013.01); *G06F 17/5031* (2013.01); *G06F 2217/62* (2013.01)

(58) Field of Classification Search
CPC ................................................. G06F 17/5068
See application file for complete search history.

(56) References Cited

U.S. PATENT DOCUMENTS

| | | |
|---|---|---|
| 6,518,813 B1 | 2/2003 | Usui |
| 7,643,601 B2 | 1/2010 | Kuwata et al. |
| 8,284,880 B2 | 10/2012 | Kim et al. |
| 2004/0083437 A1* | 4/2004 | Gullapalli ........... G06F 17/5036 716/115 |
| 2007/0194776 A1 | 8/2007 | Bossche |
| 2008/0137786 A1 | 6/2008 | Waltho |
| 2009/0228250 A1 | 9/2009 | Phillips |
| 2010/0198575 A1 | 8/2010 | Hollis |
| 2017/0161421 A1* | 6/2017 | Arp ..................... G06F 17/5072 |

FOREIGN PATENT DOCUMENTS

| | | |
|---|---|---|
| EP | 2413505 A1 | 2/2012 |
| WO | 9728611 A1 | 8/1997 |
| WO | 2013156305 A1 | 10/2013 |

OTHER PUBLICATIONS

Dong et al., "Efficient Frequency-Domain Simulation of Massive Clock Meshes Using Parallel Harmonic Balance", IEEE 2007 Custom Intergrated Circuits Conference, 2007, pp. 631-634.

* cited by examiner

*Primary Examiner* — Albert Wang
(74) *Attorney, Agent, or Firm* — Cantor Colburn LLP; Kurt Goudy

(57) ABSTRACT

A method and system to perform clock network analysis of a clock network of an integrated circuit that includes a grid obtains parameters for each transmission line of the clock network that carries a clock signal between a source of the clock signal and the grid. The method also includes obtaining models of nonlinear components of the clock network, and numerically solving a frequency domain nonlinear Harmonic Balance equation to obtain voltage values at an input and an output of each of the nonlinear components. The number of the voltage values obtained is proportional to the number of the nonlinear components. A physical implementation of the integrated circuit is obtained based on the clock network analysis.

15 Claims, 4 Drawing Sheets

CLOCK NETWORK ANALYSIS USING HARMONIC BALANCE

BACKGROUND

The present invention relates to integrated circuit design, and more specifically, to clock network analysis using harmonic balance.

Integrated circuit design or chip design, as it is commonly known, involves multiple tasks that are performed at different phases to develop a logical design into a physical implementation of the chip. One of the tasks is analysis of the on-chip clock network which examines how and when a clock signal reaches each location or node in the chip. The analysis yields a clock signal waveform at each node. The clock signal waveforms provide values of interest in clock network analysis such as, for example, timing, overshoot, and undershoot. Two different clock network architectures are clock trees and clock grids. In a clock tree, the branches are unrelated such that leaves of different branches experience different clock delays. In a clock grid, metal wires connect the endpoints of each of the clock signal paths. As such, the clock skew, or the maximum difference among delays at the endpoints, is small. The coupling among the different clock paths in a clock grid makes clock network analysis different for the clock grid architecture than for the clock tree architecture.

SUMMARY

According to embodiments of the present invention, a computer-implemented method of performing clock network analysis of a clock network of an integrated circuit that includes a grid includes obtaining parameters for each transmission line of the clock network that carries a clock signal between a source of the clock signal and the grid, and obtaining models of nonlinear components of the clock network. A frequency domain nonlinear Harmonic Balance equation is numerically solved to obtain voltage values at an input and an output of each of the nonlinear components. The number of the voltage values obtained is proportional to the number of the nonlinear components. A physical implementation of the integrated circuit is obtained based on the clock network analysis.

According to other embodiments of the invention, a system to perform clock network analysis of a clock network of an integrated circuit that includes a grid includes a memory device to store parameters for each transmission line of the clock network that carries a clock signal between a source of the clock signal and the grid and models of nonlinear components of the clock network. The system also includes a processor to numerically solve a frequency domain nonlinear Harmonic Balance equation to obtain voltage values at an input and an output of each of the nonlinear components. A number of the voltage values obtained is limited by the number of the nonlinear components and the clock network analysis is used to obtain a physical implementation of the integrated circuit.

According to yet other embodiments of the invention, a computer program product for performing clock network analysis of a clock network of an integrated circuit that includes a grid includes a computer readable storage medium having program instructions embodied therewith. The program instructions are executable by a processor to perform a method that includes obtaining parameters for each transmission line of the clock network that carries a clock signal between a source of the clock signal and the grid, and obtaining models of nonlinear components of the clock network. A frequency domain nonlinear Harmonic Balance equation is numerically solved to obtain voltage values at an input and an output of each of the nonlinear components. A number of the voltage values obtained is proportional to the number of the nonlinear components. A physical implementation of the integrated circuit is obtained based on the clock network analysis.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
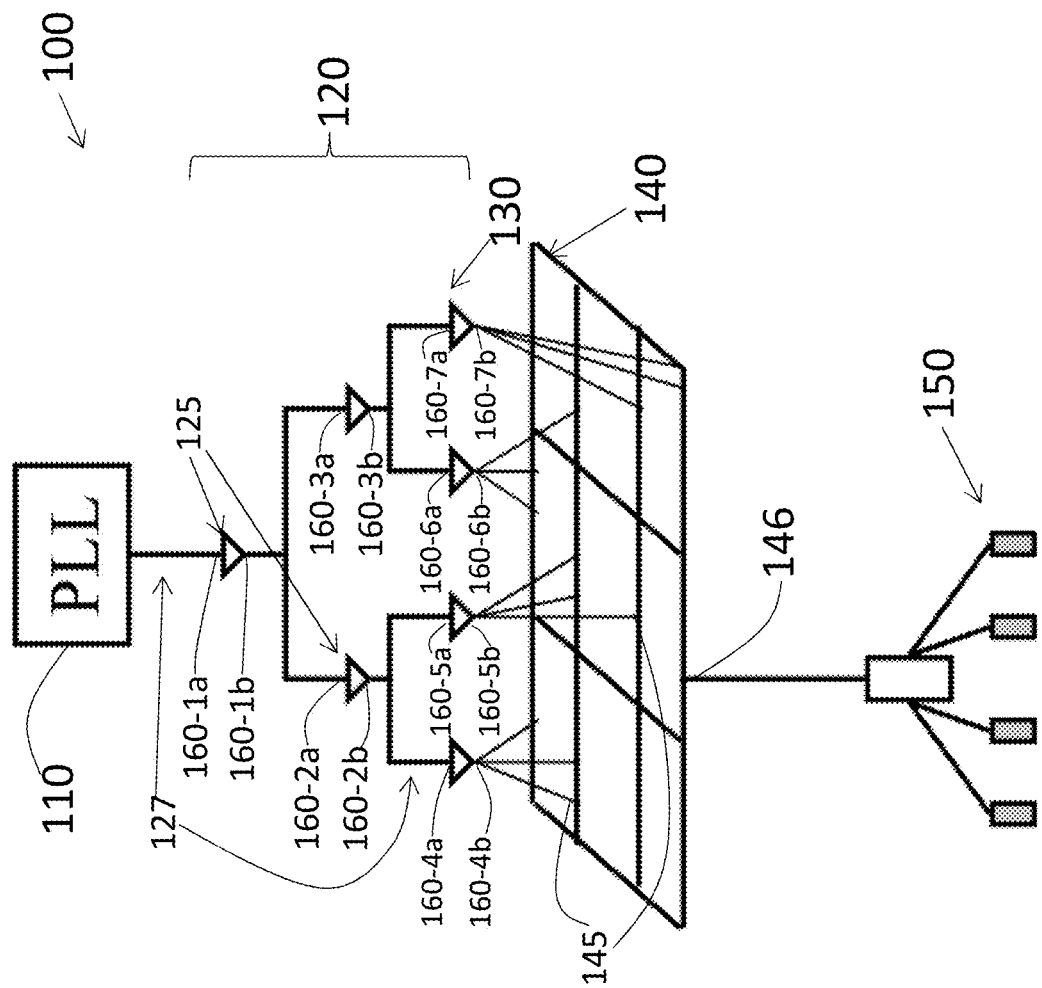
FIG. 1 is a representation of an exemplary clock network that is analyzed according to embodiments of the invention.

As previously noted, clock network analysis is used to obtain a clock signal waveform at every node of the integrated circuit (chip). Because clock networks in a clock tree architecture are decoupled, clock networks can be treated like any other signal networks by using pre-characterized gate level models for the buffers and applying model order reduction techniques for clock wires. The clock network can be analyzed as part of the standard timing analysis (STA) phase of the chip design. In contrast to a clock tree architecture, the clock grid architecture, which is the focus of the present description, involves a pervasive clock grid that is driven by many global clock buffers simultaneously. These global clock buffers drive local clock structures by means of the grid. Thus, the analysis of a clock grid network must account for the coupling of endpoints of all the different clock signal paths according to the clock grid architecture.

The clock network analysis is essentially the analysis of an electrical circuit with the currents and voltages at each grid point that are unknown. Current and voltage are determined based on knowledge of transmission line parameters such as resistance R, inductance L, capacitance C, conductance G, and line length d. Frequency-dependent parasitic extraction and accurate simulation with transmission line modeling of wires is desirable. Because thick metal layers are used for long-distance interconnects in both the clock grid and the global clock tree that drives the clock grid, inductance and transmission line effects are significant. Thick metal layers and high frequency cause inductive and distributed effects. Further, because a goal of clock grid design can be to achieve skew as low as 5 picoseconds, the analysis must be accurate to fractions of a picosecond and must incorporate not only inductors but also transmission-line effects. Transition slews, waveform overshoots, and duty cycle, as well as current densities in wires, are of interest in addition to clock latencies and skews.

One prior approach to clock network analysis used time domain analysis to determine the current and voltage at nodes, including each grid point in the clock grid that is driven by the clock tree, at each time step. Time-domain simulation of the entire tree-driven grid network is composed of transmission line models for wires and transistor level models for buffers. However, based on the size of the network and the need to integrate over many periods until steady state is reached, time-domain analysis can become computationally prohibitive.

Another prior approach to clock network analysis focused on the periodicity of clock signals. Solving for the steady state in the frequency domain was proposed. However, because the approach focused on reduced order modeling of the clock wires, it was incompatible with inductive and distributed transmission-line effects.

Turning now to an overview of the present invention, the several embodiments detailed herein pertain to a nonlinear frequency domain analysis algorithm for clock network analysis of a clock network with a grid architecture. The clock network includes linear elements including the transmission lines and non-linear elements including the buffers that drive the grid. The embodiments of the invention obtain a model at the interfaces of the linear and nonlinear elements. As a result, the size of the analysis corresponds with the dimension of the interfaces rather than with the entire clock circuit. Based on the analysis at the interfaces, the analysis at each node within the grid can be completed.

Specifically, a special formulation of the known harmonic balance algorithm facilitates full frequency-dependent, frequency-domain transmission line models for the clock wires, and direct computation of the periodic steady state. The special formulation of the Harmonic Balance generates a system of equations whose size is determined only by the number of nonlinear nodes (i.e., number of buffers) and, thus, the number of interfaces of linear to nonlinear elements, rather than the full network size. Periodic steady state is computed directly instead of simulated in as many periods as computationally feasible. In addition, frequency-dependent per-unit-length transmission line parameters are used directly as they are produced by the extractor rather than by fitting a time-domain compatible model to them. Application of the Harmonic Balance algorithm to clock network analysis facilitates analysis of the clock network in the frequency domain. As detailed below, eliminating linear components of the circuit model reduces the total number of unknowns and facilitates the practical use of the Harmonic Balance algorithm.

FIG. 1 is a representation of a tree-driven-grid clock network 100 that is analyzed according to one or more embodiments of the invention. The clock network 100 includes a phase-locked loop (PLL) 110 that is a source of the clock signal. The clock signal is propagated via transmission lines 127 through a buffered global tree 120 with buffers 125 at different levels to leaf buffers 130 at the final level of the tree 120. The leaf buffers 130 are distributed across the chip 401 (FIG. 4) to drive the clock grid 140 simultaneously via grid driving points 145. The clock grid 140, in turn, drives local clock buffers and latches 150 through tapping points 146. Although only one such tapping point 146 is shown in FIG. 1 for illustrative purposes, the clock grid 140 can have many such tapping points 146 such that the conventional clock network analysis discussed previously is impractical. To be clear, the clock signal waveforms at the numerous tapping points 146 are what are of interest ultimately. According to the embodiments of the invention described herein, the clock signal waveforms at these tapping points 146 are found by addressing the non-linear nodes, as detailed herein.

The transmission lines 127 are linear components of the clock network 100, and the buffers 125, 130 are non-linear elements of the clock network 100. The interface of each linear element (transmission line 127) and nonlinear element (buffer 125, 130) is generally referred to herein as a non-linear clock tree node 160. The exemplary clock network 100 shown in FIG. 1 includes three levels of the tree 120 that drives the clock grid 140 and fourteen non-linear clock tree nodes 160. Other clock networks 100 can include fewer or more levels of the tree 120 and fewer or more non-linear clock tree nodes 160. The non-linear clock tree nodes 160-4b, 160-5b, 160-6b, 160-7b at the interface of the leaf buffers 130 and the transmission lines 127 to the clock grid 140 are of particular interest. This is because obtaining the clock signal waveform at each of these non-linear clock tree nodes 160-4b, 160-5b, 160-6b, 160-7b facilitates obtaining the clock signal waveform at different tapping points 146 within the clock grid 140.

Figure 2:
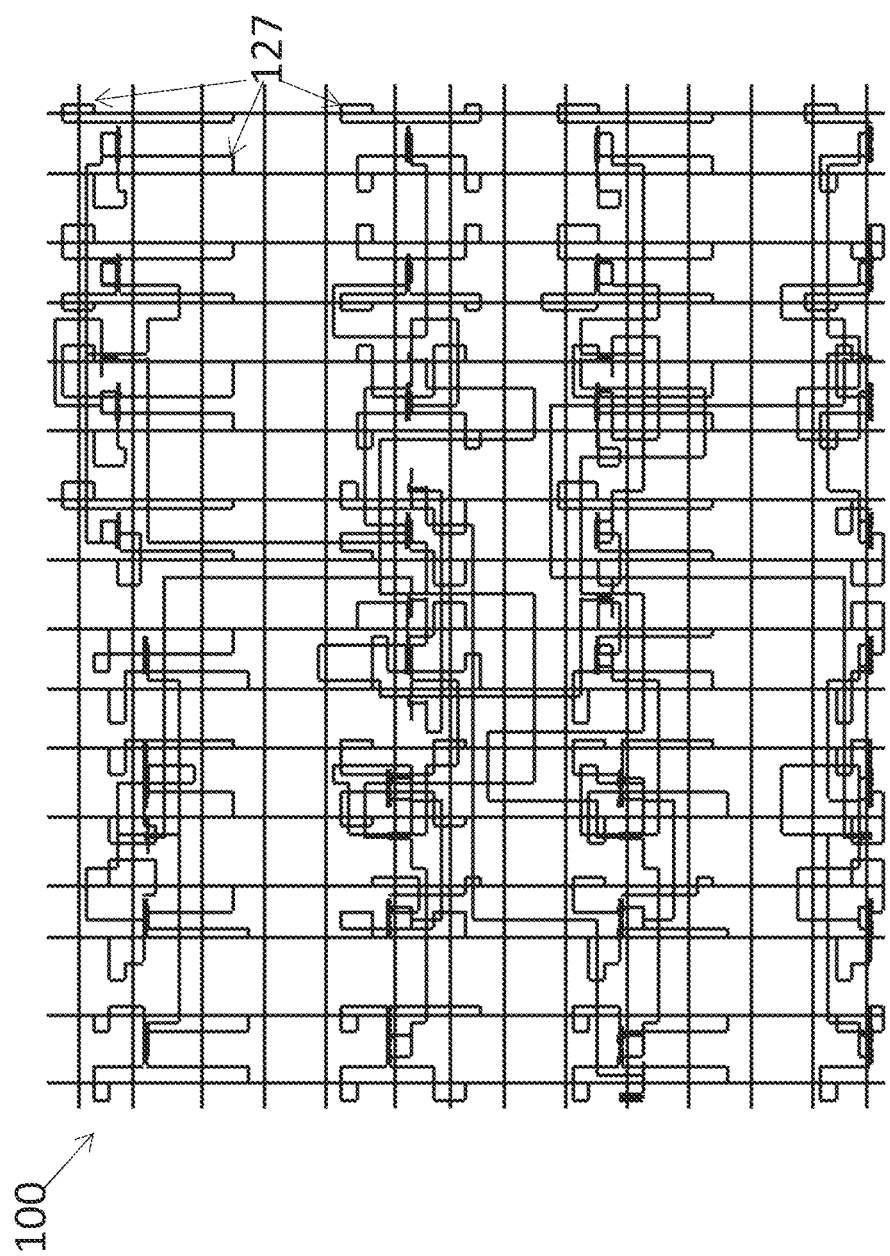
FIG. 2 shows an exemplary clock grid that is analyzed according to embodiments of the invention.

FIG. 2 shows an exemplary tree-driven-grid clock network 100 on which clock network analysis is performed according to one or more embodiments of the invention. The various transmission lines 127 (i.e., wires) of the clock network 100 must be modeled in order to obtain the clock signal waveform at the tapping points 146, 160. The transmission lines 127 shown in FIG. 2 include those from the PLL 110 within the buffered global tree 120 through the leaf buffers 130 to those within the clock grid 140. Coarser models can be used for the transmission lines 127 that connect to the local clock buffers and latches 150. The discussion herein focuses on the analysis up to the clock grid 140. Specifically, the non-linear clock tree nodes 160 are the non-linear nodes of interest and obtaining the clock signal waveforms at these non-linear nodes facilitates determining the clock network waveforms at the linear nodes, the grid driving points 145 and tapping points 146.

As previously noted, the one or more embodiments of the invention relate to obtaining frequency-dependent, frequency-domain transmission line models for the transmission lines 127. The special formulation of the Harmonic Balance algorithm is used to obtain direct computation of periodic steady state. A description of the derivation of the formulation is provided herein.

Periodic signals are represented as Fourier series. With a clock period T, all electrical signals in the clock distribution circuit can be expressed as circuit signals s(t):

$$s(t) = \sum_{k=-\infty}^{\infty} S^k e^{jk2\pi \frac{t}{T}} \qquad [\text{EQ. 1}]$$

In EQ. 1, S is a vector of Fourier coefficients. The circuit signals s(t) are assumed to be band-limited such that they can be represented by a truncated Fourier series consisting of a direct current (DC) term and $N_h$ harmonics of the fundamental frequency. Practically, the number of harmonics needed to accurately capture the signals is under 10. Thus, the Fourier series can be truncated such that the number of unknowns N is given by $2N_h+1$ terms, where $N_h$ is the number of harmonics being considered and the extra one is added for the DC term.

Then the circuit signals are given by:

$$s(t) = \sum_{k=-N_h}^{N_h} S^k e^{jk2\pi \frac{t}{T}} \qquad [\text{EQ. 2}]$$

When one period of the time-domain signals are sampled equidistantly at time intervals $\Delta T = T/N$, then:

$$s^l = s(l\Delta T) = \sum_{k=-N_h}^{N_h} S^k e^{jk 2\pi \frac{l}{N}} \qquad \text{[EQ. 3]}$$

Recognizing that the sample signals are proportional to the Inverse Discrete Fourier Transform (IDFT) of the Fourier coefficients, the equidistant time domain sample s and the frequency domain Fourier coefficients S have the following relationships:

$$S = F \cdot s \qquad \text{[EQ. 4]}$$

$$s = F^{-1} \cdot S \qquad \text{[EQ. 5]}$$

As previously noted, S is the vector of Fourier coefficients and s is the vector of time-domain samples. That is:

$$S = [S_{-N_h}, \ldots, S_{N_h}] \qquad \text{[EQ. 6]}$$

The operator F can be represented as a matrix with a special structure. Operations such as multiplication of a vector by F or $F^{-1}$ can be implemented using the fast Fourier transform (FFT) algorithm. The vector of samples of the time differentiated signal $\dot{s}$ gives the following:

$$F\dot{s} = \Omega S \qquad \text{[EQ. 7]}$$

where $$\Omega = \text{diag}\left[-jk\frac{2\pi}{T}, \ldots, 0, \ldots, jk\frac{2\pi}{T}\right] \qquad \text{[EQ. 8]}$$

The transmission line equations in the frequency domain are obtained as detailed below. Terminal voltages V and currents I of a multi-conductor transmission line 127 can be expressed in terms of the resistance R, inductance L, capacitance C, conductance G, and transmission line length d:

$$\begin{bmatrix} V_2 \\ I_2 \end{bmatrix} = e^{\begin{bmatrix} 0 & -(R+j\omega L) \\ -(G+j\omega C) & 0 \end{bmatrix} d} \begin{bmatrix} V_1 \\ I_1 \end{bmatrix} \qquad \text{[EQ. 9]}$$

The indices 1 and 2 are used to denote the two ends of the transmission line 127. For nodal analysis, the terminal currents I can be expressed as a function of the terminal voltages V and the Y-parameter matrix:

$$\begin{bmatrix} I_1 \\ I_2 \end{bmatrix} = \begin{bmatrix} h_{11}(\omega) & h_{12}(\omega) \\ h_{21}(\omega) & h_{22}(\omega) \end{bmatrix} \begin{bmatrix} V_1 \\ V_2 \end{bmatrix} \qquad \text{[EQ. 10]}$$

As EQ. 9 indicates, the entries h of the Y-parameter matrix of EQ. 10 are easily computable for a given frequency $\omega$ because the resistance R, inductance L, capacitance C, conductance G, and transmission line length d are known. All the linear components of the clock network 100, wires 210, and lumped R, L, C models, vias, and other components will result in a large frequency domain system of equations for any given frequency $\omega_k$:

$$I(\omega_k) = Y(\omega_k) \cdot V(\omega_k) \qquad \text{[EQ. 11]}$$

In EQ. 11, $V(\omega_k)$ is a matrix of voltages at all nodes (including non-linear clock tree nodes 160, grid driving points 145, and tapping points 146) of the clock network 100, $Y(\omega_k)$ is a frequency-specific complex matrix, and $I(\omega_k)$ is a matrix that represents the sum of the currents flowing into every node.

The variables can be partitioned according to their being part of the nonlinear side of the circuit ($I_N^k$, $V_N^k$) or being exclusive to the linear network ($V_L^k$, $I_L^k$), where N denotes nonlinear and L denotes linear. This partitioning between the linear and nonlinear sides leads to the partitioning of the Y-matrix:

$$\begin{bmatrix} 0 \\ I_N^k \end{bmatrix} = \begin{bmatrix} Y_{LL}^k & Y_{LN}^k \\ Y_{NL}^k & Y_{NN}^k \end{bmatrix} \begin{bmatrix} V_L^k \\ V_N^k \end{bmatrix} \qquad \text{[EQ. 12]}$$

The current sums at nodes that do not flow into the nonlinear part (e.g., current through transmission lines 127 within the grid 140) must sum to zero by Kirchhoff's current law (KCL). As a consequence, the purely linear unknowns $V_L^k$ can be eliminated from EQ. 12. These are the voltages associated with the grid driving points 145 and tapping points 146. The result for a given frequency $\omega$, based on the Schur complement $y^k$, is:

$$I_N^k = (Y_{NN} - Y_{NL} Y_{LL}^{-1} Y_{LN})^k V_N^k = y^k V_N^k \qquad \text{[EQ. 13]}$$

The Fourier vectors of the voltages $V_N$, which are associated with the non-linear clock tree nodes 160, are then connected to the Fourier coefficient vectors of the currents $I_N$ as:

$$I_N = y V_N \qquad \text{[EQ. 14]}$$

In EQ. 14, y is given by:

$$y = \text{diag}[y^{-N_h}, \ldots, y^{N_h}] \qquad \text{[EQ. 15]}$$

The leaf buffers 130, which are nonlinear elements, are modeled at the transistor level or by higher-level current source models. The models are expressed in the time domain as:

$$i(t) = j(x(t)) + \frac{d}{dt} q(x(t)) \qquad \text{[EQ. 16]}$$

However, for the purpose of Harmonic Balance analysis, the operator must be expressed in terms of a mapping from the Fourier coefficients of the inputs X to the Fourier coefficients of the output I. The signals can be assumed to be band-limited for this operation. Assuming that the input time domain vector is sampled at $x = [x^0, x^1, \ldots, x^{N-1}]$, the samples of the two components of the nonlinear terms can be evaluated as:

$$j = [j(x^0), \ldots, j(x^{N-1})] \qquad \text{[EQ. 17]}$$

$$q = [q(x^0), \ldots, q(x^{N-1})] \qquad \text{[EQ. 18]}$$

According to the notation in EQ. 17 and EQ. 18 and based on EQ. 4 and EQ. 5, $$J(X) = F[j(\bullet)] F^{-1} X \qquad \text{[EQ. 19]}$$

$$Q(X) = F[q(\bullet)] F^{-1} X \qquad \text{[EQ. 20]}$$

$$I(X) = J(X) + \Omega Q(X) = F[j(\bullet)] F^{-1} X + \Omega F[q(\bullet)] F^{-1} X \qquad \text{[EQ. 21]}$$

EQ. 14 gives the current into the nonlinear components (e.g., buffers 125, 130) and EQ. 21 gives current within the nonlinear components. Thus, according to the KCL, the current obtained by EQ. 14 and the current obtained by EQ.

21 must sum to 0. Accordingly, EQ. 14 and EQ. 21 can be summed to obtain the special formulation of the Harmonic Balance equation:

$$yV_N + J(V_N) + \Omega Q(V_N) = 0 \quad [\text{EQ. 22}]$$

EQ. 22 is nonlinear and algebraic and $V_N$ can be solved using a Newton algorithm. As previously noted, the size of the system (i.e., the number of elements of the vector $V_N$) is equal to the number of non-linear clock tree nodes 160 multiplied by the number of necessary harmonics. In the exemplary clock network 100 shown in FIG. 1, there are fourteen non-linear clock tree nodes 160 and, thus, fourteen multiplied by the number of harmonics (e.g., 10) elements of $V_N$ to be obtained. The matrices involved in solving the system are amenable to iterative methods. That is, y in the first term of EQ. 22 can be computed. Then, based on the current models used to obtain EQ. 16 and, subsequently, EQ. 19 and EQ. 20, $V_N$ can be solved iteratively. Once EQ. 22 is solved to obtain the nonlinear unknowns, the linear values ($V_L^k$) in the clock grid 140, which correspond with the grid driving points 145 and tapping points 146, can be solved using EQ. 12.

Figure 3:
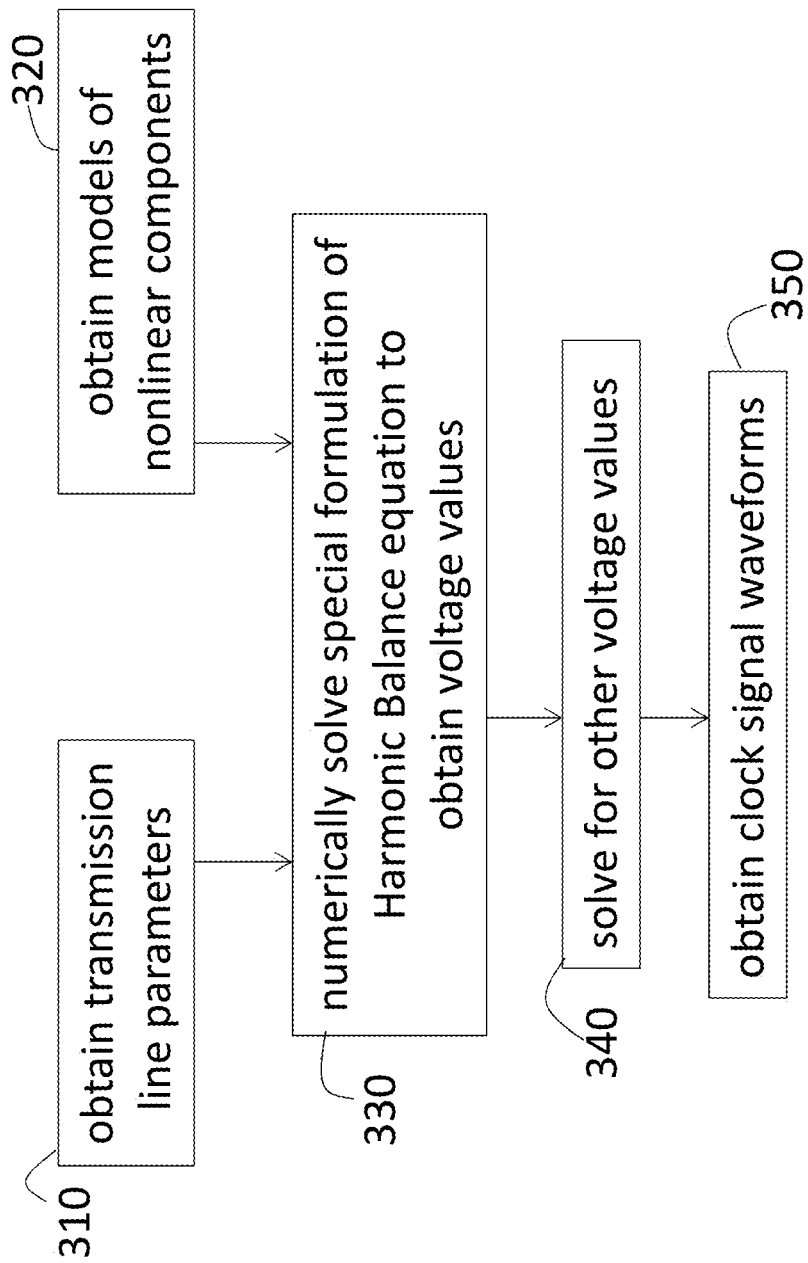
FIG. 3 is a process flow of a method of analyzing a clock network according to embodiments of the invention.
Figure 4:
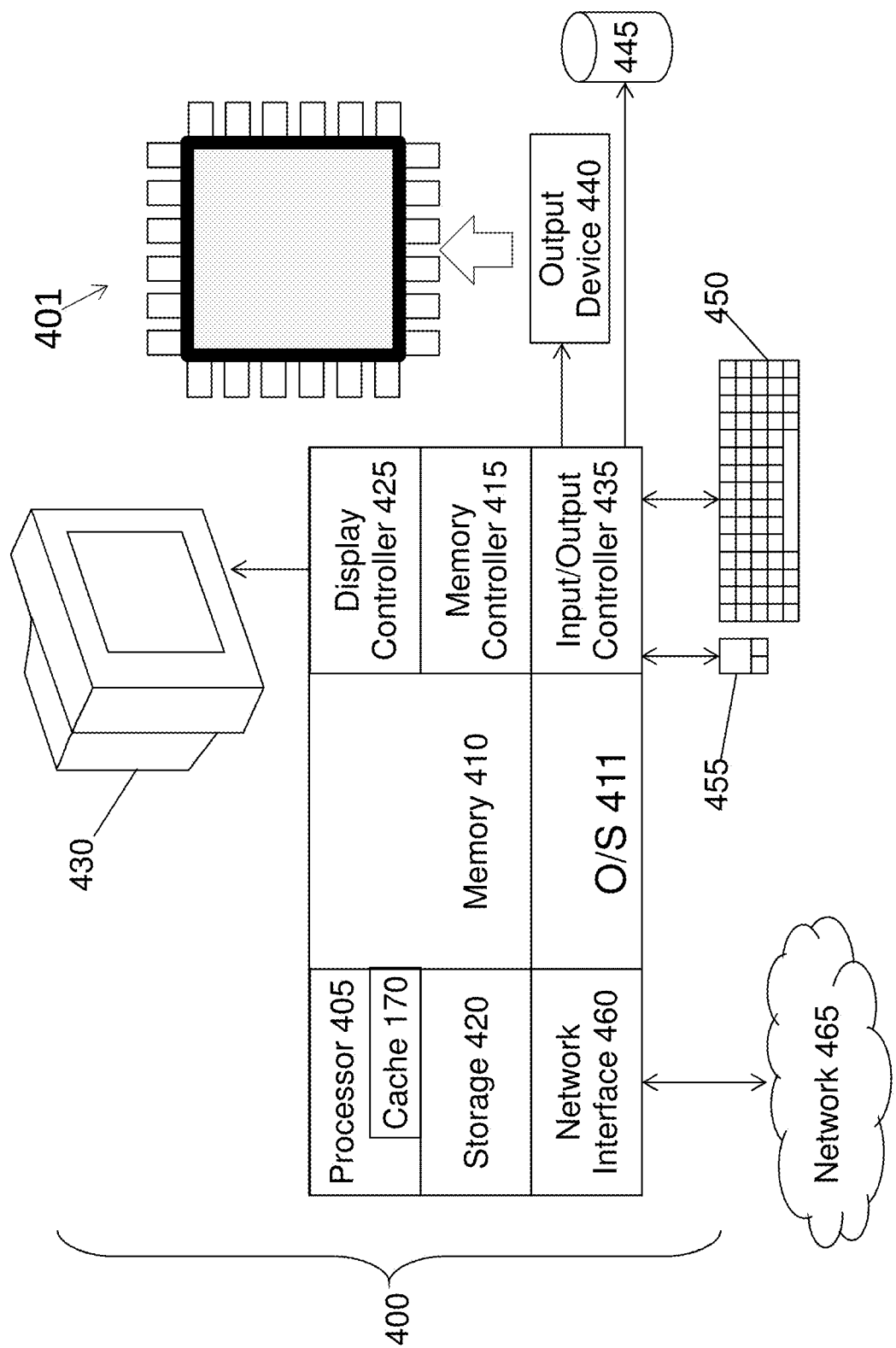
FIG. 4 is a block diagram of a system to analyze and clock network and provide an integrated circuit according to embodiments of the invention.

FIG. 3 is a process flow of a method of performing clock network 100 analysis according to embodiments of the invention. According to the process flow shown in FIG. 3, clock signal waveforms are obtained at each node (e.g., tapping point 145, grid driving point 146, non-linear clock tree node 160) in a clock network 100 that includes a clock tree 120 that drives a clock grid 140. The clock signal waveforms are obtained at the non-linear clock tree nodes 160 (non-linear nodes), and those clock signal waveforms are used to obtain the clock signal waveforms at the grid driving points 145 and tapping points 146 (linear nodes). The clock signal waveforms are obtained as part of the design and verification process to ultimately obtain a physical implementation of the integrated circuit 401 (FIG. 4). At block 310, obtaining transmission line parameters includes obtaining resistance R, inductance L, capacitance C, conductance G, and line length d in order to obtain the Y matrix according to EQ. 9, which provides y in the first term of EQ. 22. The transmission line parameters can be stored in a memory device (e.g., memory 410 of the system 400 (FIG. 4) that performs the clock network analysis according to embodiments of the invention). At block 320, obtaining models of nonlinear components includes obtaining transistor or higher-level current source models. The models can also be stored in a memory device (e.g., memory 410).

Numerically solving a special formulation of the Harmonic Balance equation to obtain voltage values, at block 330, refers to solving EQ. 22 to obtain voltage values $V_N$ at the non-linear clock tree nodes 160. The numerical solution involves iteratively evaluating current models for values of $V_N$. EQ. 22 is a nonlinear algebraic equation obtained based on the fact that the current within a nonlinear component and the current into or out of the nonlinear component must be the same (must sum to 0 according to the KCL. Once the values of $V_N$ are obtained, solving for other voltage values, at block 340, refers to obtaining $V_L$ according to EQ. 12. These include voltages at nodes in the clock grid 140 (grid driving points 145 and tapping points 146). Obtaining clock signal waveforms, at block 350, refers to obtaining the desired clock signal information from the voltages and corresponding currents determined at blocks 330 and 340.

FIG. 4 is a block diagram of a system 400 that performs clock network analysis according to one or more embodiments of the invention discussed herein. The design output by the system 100 based on processes including the clock network analysis according to one or more embodiments of the invention results in a physical implementation of the logic design in the form of the integrated circuit 401. The system 100 and methods described herein can be implemented in hardware, software (e.g., firmware), or a combination thereof. In some embodiments of the invention, the methods described can be implemented, at least in part, in hardware and can be part of the microprocessor of a special or general-purpose computer system, such as a personal computer, workstation, minicomputer, or mainframe computer.

In some embodiments of the invention, as shown in FIG. 4, the system 400 includes a processor 405, memory 410 coupled to a memory controller 415, and one or more input devices 445 and/or output devices 440, such as peripherals, that are communicatively coupled via a local I/O controller 435. These devices 440 and 445 can include, for example, a printer, a scanner, a microphone, and the like. Input devices such as a conventional keyboard 450 and mouse 455 can be coupled to the I/O controller 435. The I/O controller 435 can be, for example, one or more buses or other wired or wireless connections, as are known in the art. The I/O controller 435 can have additional elements, which are omitted for simplicity, such as controllers, buffers (caches), drivers, repeaters, and receivers, to enable communications.

The I/O devices 440, 445 can further include devices that communicate both inputs and outputs, for instance disk and tape storage, a network interface card (NIC) or modulator/demodulator (for accessing other files, devices, systems, or a network), a radio frequency (RF) or other transceiver, a telephonic interface, a bridge, a router, and the like.

The processor 405 is a hardware device for executing hardware instructions or software, particularly those stored in memory 410. The processor 405 can be a custom made or commercially available processor, a central processing unit (CPU), an auxiliary processor among several processors associated with the system 400, a semiconductor based microprocessor (in the form of a microchip or chip set), a macroprocessor, or other device for executing instructions. The processor 405 includes a cache 470, which can include, but is not limited to, an instruction cache to speed up executable instruction fetch, a data cache to speed up data fetch and store, and a translation lookaside buffer (TLB) used to speed up virtual-to-physical address translation for both executable instructions and data. The cache 470 can be organized as a hierarchy of more cache levels (L1, L2, etc.).

The memory 410 can include one or combinations of volatile memory elements (e.g., random access memory, RAM, such as DRAM, SRAM, SDRAM, etc.) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 410 can incorporate electronic, magnetic, optical, or other types of storage media. Note that the memory 410 can have a distributed architecture, where various components are situated remote from one another but can be accessed by the processor 405.

The instructions in memory 410 can include one or more separate programs, each of which comprises an ordered listing of executable instructions for implementing logical functions. In the example of FIG. 4, the instructions in the memory 410 include a suitable operating system (OS) 411. The operating system 411 essentially can control the execution of other computer programs and provides scheduling, input-output control, file and data management, memory management, and communication control and related services.

Additional data, including, for example, instructions for the processor 405 or other retrievable information, can be stored in storage 420, which can be a storage device such as a hard disk drive or solid state drive. The stored instructions in memory 110 or in storage 420 can include those enabling the processor to execute one or more aspects of the system 400 and methods of this detailed description.

The system 400 can further include a display controller 425 coupled to a monitor 430. In some embodiments of the invention, the system 400 can further include a network interface 460 for coupling to a network 465. The network 465 can be an IP-based network for communication between the system 400 and an external server, client and the like via a broadband connection. The network 465 transmits and receives data between the system 400 and external systems. In some embodiments of the invention, the network 465 can be a managed IP network administered by a service provider. The network 465 can be implemented in a wireless fashion, e.g., using wireless protocols and technologies, such as WiFi, WiMax, etc. The network 465 can also be a packet-switched network such as a local area network, wide area network, metropolitan area network, the Internet, or other similar type of network environment. The network 465 can be a fixed wireless network, a wireless local area network (LAN), a wireless wide area network (WAN) a personal area network (PAN), a virtual private network (VPN), intranet or other suitable network system and can include equipment for receiving and transmitting signals.

The present invention can be a system, a method, and/or a computer program product. The computer program product can include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention can be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments of the invention, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions can also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form described. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There can be many variations to this diagram or the steps (or operations) described therein without departing from the spirit of the invention. For instance, the steps can be performed in a differing order or steps can be added, deleted or modified. All of these variations are considered a part of the claimed invention.

While the preferred embodiment to the invention had been described, it will be understood that those skilled in the art, both now and in the future, can make various improvements and enhancements which fall within the scope of the claims which follow. These claims should be construed to maintain the proper protection for the invention first described.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer-implemented method of performing clock network analysis of a clock network of an integrated circuit that includes a grid, the method comprising:
   obtaining parameters for each transmission line of the clock network that carries a clock signal between a source of the clock signal and the grid, wherein the obtaining the parameters includes obtaining resistance R, inductance L, capacitance C, conductance G, and line length d;
   obtaining models of nonlinear components of the clock network;
   numerically solving, using a processor, a frequency domain nonlinear Harmonic Balance equation to obtain voltage values at an input and an output of each of the nonlinear components, wherein a number of the voltage values obtained is proportional to the number of the nonlinear components, wherein the numerically solving the Harmonic Balance equation includes iteratively evaluating the models of the nonlinear components for a candidate voltage value; and
   obtaining a physical implementation of the integrated circuit based on the clock network analysis.

2. The computer-implemented method according to claim 1, further comprising obtaining other voltage values associated with linear components of the clock network based on the voltage values.

3. The computer-implemented method according to claim 1, further comprising obtaining current values corresponding with the voltage values, wherein the voltage values and the current values represent clock signal waveforms for the clock network analysis and the clock network analysis includes determining timing, undershoot, and overshoot.

4. The computer-implemented method according to claim 1, wherein the obtaining the models includes obtaining transistor-level current source models of buffers.

5. The computer-implemented method according to claim 1, wherein the numerically solving the Harmonic Balance equation includes using the parameters of the transmission line respective to the nonlinear component.

6. A system to perform clock network analysis of a clock network of an integrated circuit that includes a grid, the system comprising:
   a memory device configured to store parameters for each transmission line of the clock network that carries a clock signal between a source of the clock signal and the grid and models of nonlinear components of the clock network, wherein the parameters include resistance R, inductance L, capacitance C, conductance G, and line length d; and
   a processor configured to numerically solve a frequency domain nonlinear Harmonic Balance equation to obtain voltage values at an input and an output of each of the nonlinear components, wherein a number of the voltage values obtained is limited by the number of the nonlinear components and the clock network analysis is used to obtain a physical implementation of the integrated circuit, wherein the processor numerically solves the Harmonic Balance equation by iteratively evaluating the models of the nonlinear components for a candidate voltage value.

7. The system according to claim 6, wherein the processor is further configured to obtain other voltage values associated with linear components of the clock network based on the voltage values.

8. The system according to claim 6, wherein the processor is further configured to obtain current values corresponding with the voltage values, wherein the voltage values and the current values represent clock signal waveforms for the clock network analysis and the clock network analysis includes determining timing, undershoot, and overshoot.

9. The system according to claim 6, wherein the models include transistor-level current source models of buffers.

10. The system according to claim 6, wherein the processor numerically solves the Harmonic Balance equation by using the parameters of the transmission line respective to the nonlinear component.

11. A non-transitory computer program product for performing clock network analysis of a clock network of an integrated circuit that includes a grid, the computer program product comprising a computer readable storage medium having program instructions embodied therewith, the program instructions executable by a processor to perform a method comprising:

obtaining parameters for each transmission line of the clock network that carries a clock signal between a source of the clock signal and the grid, wherein the obtaining the parameters includes obtaining resistance R, inductance L, capacitance C, conductance G, and line length d;

obtaining models of nonlinear components of the clock network;

numerically solving a frequency domain nonlinear Harmonic Balance equation to obtain voltage values at an input and an output of each of the nonlinear components, wherein a number of the voltage values obtained is proportional to the number of the nonlinear components, wherein the numerically solving the Harmonic Balance equation includes iteratively evaluating the models of the nonlinear components for a candidate voltage value; and obtaining a physical implementation of the integrated circuit based on the clock network analysis.

12. The computer program product according to claim 11, further comprising obtaining other voltage values associated with linear components of the clock network based on the voltage values.

13. The computer program product according to claim 11, further comprising obtaining current values corresponding with the voltage values, wherein the voltage values and the current values represent clock signal waveforms for the clock network analysis and the clock network analysis includes determining timing, undershoot, and overshoot.

14. The computer program product according to claim 11, wherein the obtaining the models includes obtaining transistor-level current source models of buffers.

15. The computer program product according to claim 11, wherein the numerically solving the Harmonic Balance equation includes using the parameters of the transmission line respective to the nonlinear component.

* * * * *